(12) United States Patent
Yu et al.

(10) Patent No.: US 6,791,666 B2
(45) Date of Patent: Sep. 14, 2004

(54) VARIABLE TRANSMISSION FOCAL MASK FOR LENS HEATING COMPENSATION

(75) Inventors: Yuan-Cheng Yu, Hsinchu (TW); Chin-Chuan Hsieh, Hsin-Chu (TW)

(73) Assignee: Taiwan Semiconductor Manufacturing Co., Ltd, Hsin Chu (TW)

(*) Notice: Subject to any disclaimer, the term of this patent is extended or adjusted under 35 U.S.C. 154(b) by 85 days.

(21) Appl. No.: 09/996,981

(22) Filed: Nov. 19, 2001

(65) Prior Publication Data

US 2003/0095243 A1 May 22, 2003

(51) Int. Cl.[7] ........................... G03B 27/52; G03B 27/72
(52) U.S. Cl. ........................................ 355/55; 355/71
(58) Field of Search ........................... 355/52, 55, 56, 355/67, 68, 69, 71, 77; 349/4

(56) References Cited

U.S. PATENT DOCUMENTS 5,883,704 A * 3/1999 Nishi et al. ............... 355/67
6,333,780 B1 * 12/2001 Tsukuda ..................... 355/68
6,486,939 B2 * 11/2002 Lin ............................ 355/53

\* cited by examiner

Primary Examiner—Rodney Fuller
(74) Attorney, Agent, or Firm—Tung & Associates

(57) ABSTRACT

A variable transmission focal mask to compensate lens heating is disclosed. A semiconductor fabrication alignment and exposure equipment includes an exposure and alignment unit, a variable transmission mask, and a stage. The unit has a light source and a lens. The mask is under the lens, and at least indirectly measures focus. The mask further can adjust the focus in real time in response to determining that the focus is out of specification. A wafer is placed on the stage for exposure to the light source through a mask or a reticle. The variable transmission mask normally has a substantially high transmission of light rating that can be adjusted downward to adjust the focus. For example, the mask can be a liquid crystal display (LCD) that can be darkened to so reduce its transmission of light rating.

18 Claims, 4 Drawing Sheets

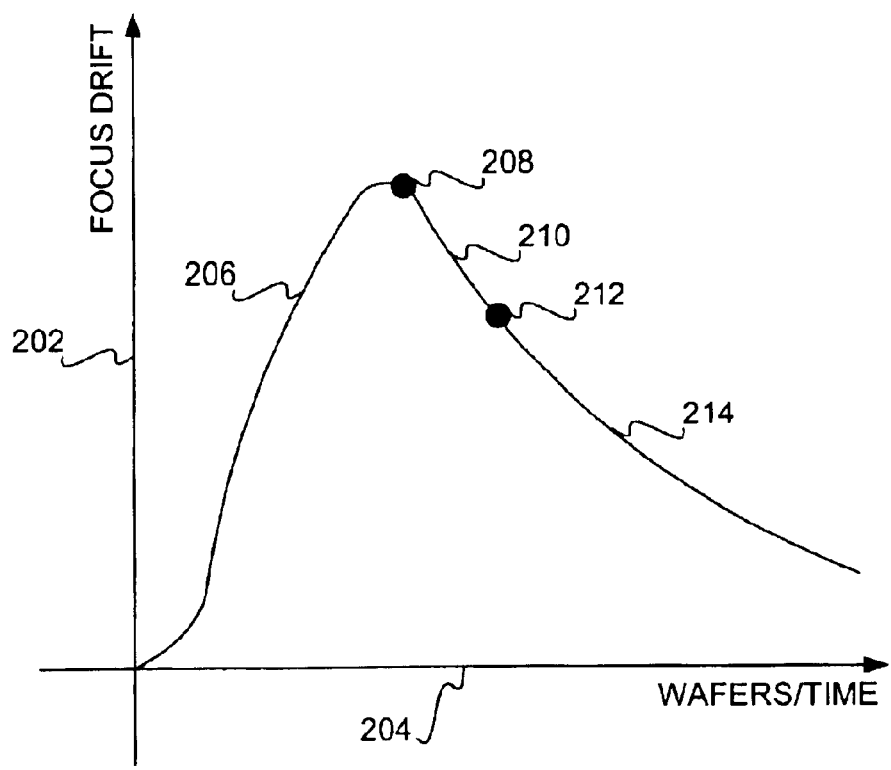
FIG 2
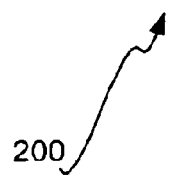

VARIABLE TRANSMISSION FOCAL MASK FOR LENS HEATING COMPENSATION

FIELD OF THE INVENTION

This invention relates generally to semiconductor fabrication equipment, and more particularly to steppers and scanners.

BACKGROUND OF THE INVENTION

Steppers and scanners are types of semiconductor fabrication equipment used in photolithographic processing, such as aligning a mask over a wafer and exposing the pattern of the mask onto the wafer. A scanner typically uses a mirror system with a slit blocking part of the light coming from the light source. The size of the slit is smaller than the wafer, so the light beam scans across the wafer. Whereas scanning is generally performed on a per-wafer basis, a stepper is utilized on only a given part of the wafer at one time. A reticle is aligned and exposed, without scanning, and then is stepped to the next site and the process is repeated. Stepping generally allows more precise matching of larger-diameter wafers than scanners do.

Another type of semiconductor fabrication equipment combines the stepping and scanning process of steppers and scanners, and is known as step and scan aligners. At one position on the semiconductor wafer, a small-scale scanning process takes place, and then the reticle or mask is stepped to the next position, where the scanning process is repeated. As used herein, steppers, scanners, and step and scan aligners are generally encompassed under the term alignment and exposure equipment, which can include other types of specific semiconductor fabrication equipment besides steppers, scanners, and step and scan aligners. Examples of steppers, scanners, and step and scan aligners include those available from ASML Holding, N.V., of the Netherlands. Furthermore, unless otherwise and specifically noted, steppers, scanners, and step and scan aligners are used substantially interchangeably herein, such that reference to or description of one should be assumed to apply to other types of alignment and exposure equipment as well.

Scanners and steppers can generally achieve a degree of focus for a given exposure time. A process window, such as an exposure-defocus (ED) window, maps the ranges within which acceptable lithographic quality occurs. The process window for a given feature shows the ranges of exposure dose and depth of focus (DOF) that permit acceptable lithographic quality for the semiconductor device being fabricated.

For example, FIG. 1 shows a graph 100 of a typical ED process window for a given semiconductor pattern feature. The y-axis 102 indicates exposure dose of the light source being used, whereas the x-axis 104 indicates DOF. The line 106 maps exposure dose versus DOF at one end of the tolerance range for the critical dimension (CD) of the pattern feature, whereas the line 108 maps exposure dose versus DOF at the other end of the tolerance range for the CD of the feature.

The area 110 enclosed by the lines 106 and 108 is the ED process window for the pattern feature, indicating the ranges of both DOF and exposure dose that permit acceptable lithographic quality of the feature. Any DOF-exposure dose pair that maps within the area 110 permits acceptable lithographic quality of the pattern feature. As indicated by the area 110, the process window is typically indicated as a rectangle, but this is not always the case, nor is it necessary.

A difficulty with using any process window, however, is that the focus of the stepper or scanner generally changes, or drifts, over time. One of the causes of focus drift over time is the heat subjected on the lens from the light source. As heat builds up on the lens, the focus of the lens can sufficiently change to affect the process window for the critical dimensions of the semiconductor device being fabricated. To compensate for this, most lens have a heating factor that can be adjusted to stabilize focus.

However, the focus and image sensors of most steppers and scanners cannot monitor focus drift in real time, but rather can only indicate the focus after processing of a given number of wafers has been accomplished. This makes it difficult to tune the heating factor to compensate for the heating of the lens, and results in the inability to compensate for undesirable focus drift. In turn, the undesirable focus drift effectively reduces the process window for the lithographic processing, and decreases CD uniformity.

FIG. 2 shows a graph 200 depicting undesirable focus drift and the general inability of current steppers and scanners to counter it. The y-axis 202 measures focus drift, whereas the x-axis 204 measures time, or more specifically the number of wafers that have been so far processed on a given stepper or scanner. Focus drift increases to an unacceptable level throughout initial processing of the wafers by the stepper or scanner, as indicated by the line 206. At the point 208, processing has been completed of the current lot of wafers, and the mask or reticle of the stepper or scanner is changed.

This change allows a cool-down period, indicated by the line 210, in which the stepper or scanner is not being used, such that focus drift is effectively decreasing. At the point 212, processing continues again. Focus drift then decreases, as indicated by the line 214, because the heating factor of the lens can be modified before starting processing again. The heating factor of the lens cannot be modified while processing is occurring, however.

Therefore, there is a need for lens heating compensation that overcomes the disadvantages associated with such compensation as found in the prior art. Specifically, there is a need for compensating for lens heating that reduces undesirable focus drift. Such a reduction in focus drift should prevent process window reduction, and maintain CD uniformity. Furthermore, there is a need for compensating for lens heating that can be accomplished substantially in real time. For these and other reasons, there is a need for the present invention.

SUMMARY OF THE INVENTION

The invention relates to a variable transmission focal mask to compensate lens heating. A semiconductor fabrication alignment and exposure equipment includes an exposure and alignment unit, a variable transmission mask, and a stage. The unit has a light source and a lens. The mask is under the lens, and at least indirectly measures focus. The mask further can adjust the focus in real time in response to determining that the focus is out of specification. A wafer is placed on the stage for exposure to the light source through a mask or a reticle. The variable transmission mask preferably normally has a substantially high transmission of light rating that can be adjusted downward to adjust the focus. For example, the mask can be a liquid crystal display (LCD) that can be darkened to so reduce its transmission of light rating.

Embodiments of the invention provide for advantages over the prior art. The variable transmission mask normally passes through a high percentage of the light from the light source of the exposure and alignment, such as 90%. However, as the lens of the exposure and alignment unit heats up, the focus of the mask on the semiconductor wafer drifts. This is detected by the variable transmission mask, and in response the mask darkens, or otherwise reduces the transmission of light therethrough, maintaining the focus. Thus, reducing the transmission of light through the variable transmission mask compensates for the heating of the lens, and the focus drift that this heating causes. Other advantages, embodiments, and aspects of the invention will become apparent by reading the detailed description that follows, and by referencing the attached drawings.

BRIEF DESCRIPTION OF THE DRAWINGS

FIG. 2 is a graph showing focus drift as the number of wafers process increases, or over time.

DETAILED DESCRIPTION OF THE INVENTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

Figure 1:
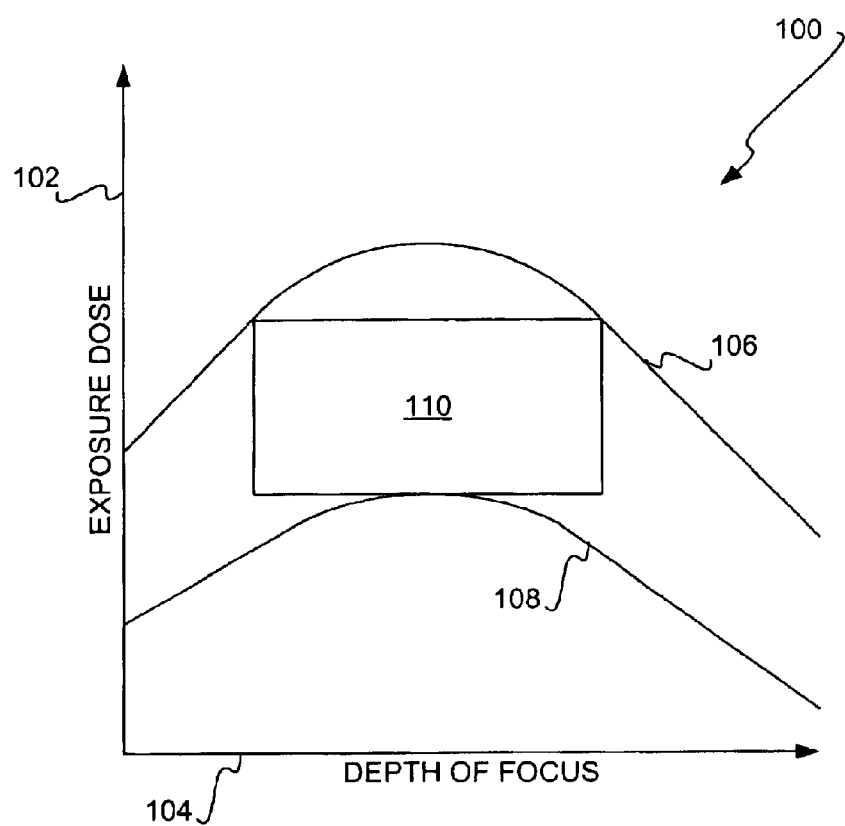
FIG. 1 is a diagram showing an example process window for semiconductor fabrication.
Figure 3:
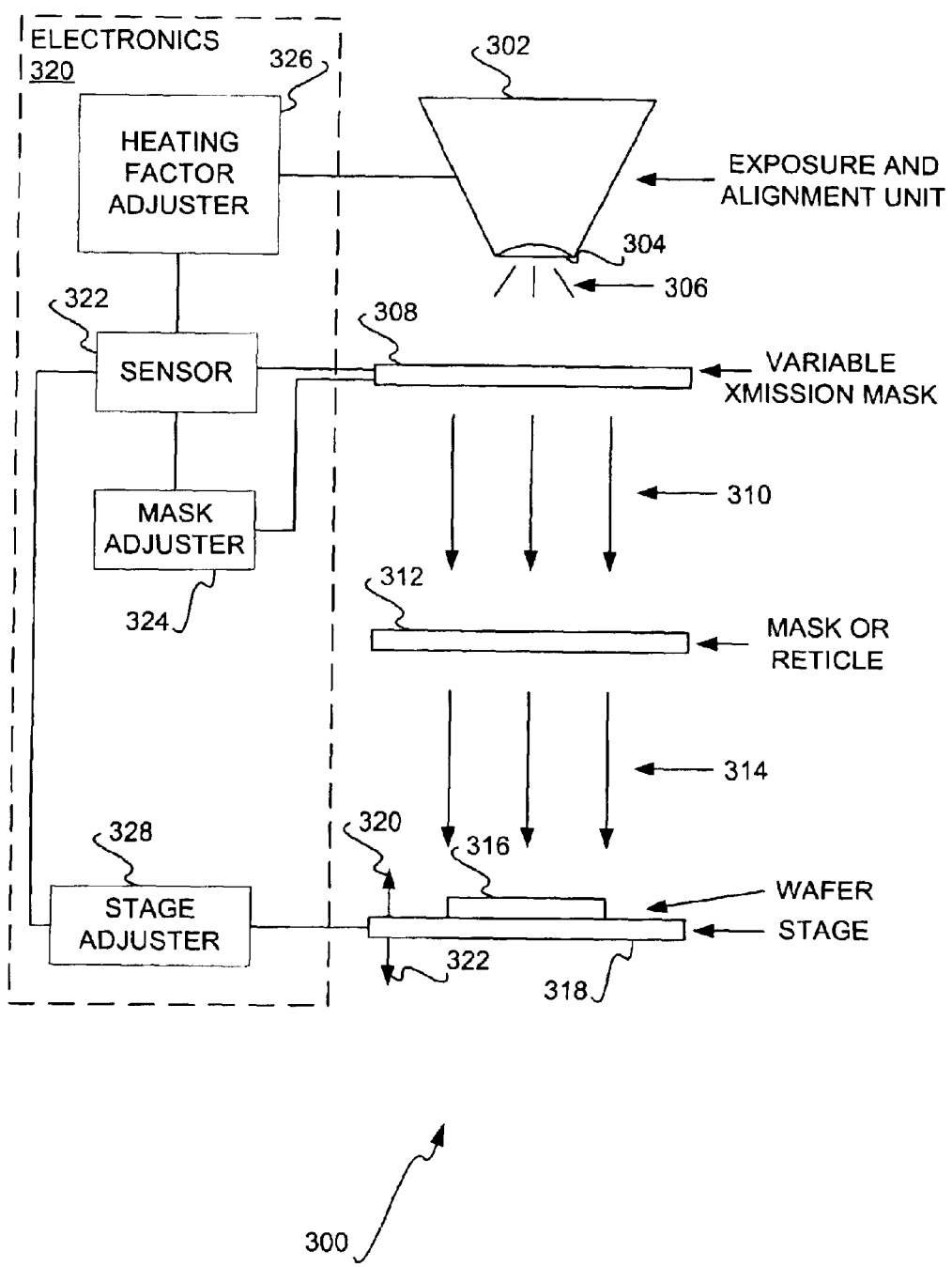
FIG. 3 is a diagram of a system including a variable transmission mask according to an embodiment of the invention.

FIG. 3 shows a system 300 according to an embodiment of the invention. The system includes an exposure and alignment unit 302, that has a light source not shown in FIG. 3, and a lens 304. Light 306 emanates from the light source through the lens 304. The unit 302 may be a stepper, a scanner, a step and scan aligner, or another type of exposure and alignment unit. For example, the unit 302 may be an exposure and alignment unit available from ASML, N.V. The unit 302 is used for photolithographic processing of a semiconductor wafer 316, to assist in the fabrication of semiconductor devices on the wafer 316.

A variable transmission focal mask 308 is positioned below the lens 304 of the exposure and alignment unit 302. The mask 308 may also be positioned elsewhere in relation to the other components of the system 300. The mask 308 has a transmission of light rating that can vary. For instance, the mask 308 may be a liquid crystal display (LCD) that normally passes 90% of light therethrough. As more transistors of LCD are turned on, the mask 308 darkens, reducing the amount of light that passes through the focal mask 308. The mask 308 may also have other functions and purposes.

A mask or reticle 312, preferably with a desired semiconductor pattern imprinted thereon, is below the mask 308. The light passes through the mask 308, as indicated by the arrows 310, and then through the mask or reticle 312, as indicated by the arrows 314, according to the pattern imprinted on the mask or reticle 312. It then reaches the semiconductor wafer 316 on the vertically movable stage 318. In this way, the light exposes photoresist coated on the wafer 316, such that subsequent development removes the photoresist, so that etching and other processes can be performed to assist in the manufacture of semiconductor devices on the wafer 316. The stage 318 is vertically movable up and down, as indicated by the arrows 320 and 322, respectively.

After the exposure and alignment unit 304 is initially adjusted so that a clear and sharp image of the mask or reticle 312 is focused on the surface of the wafer 316, the lens 304 of the unit 304 heats up, causing the focus to drift. Electronics 320, in conjunction with the variable transmission mask 308, compensates for this focus drift. All components within the electronics 320 are preferably electrical components. The sensor 322, which as depicted in FIG. 3, is communicatively coupled to the mask 308, although it can be positioned elsewhere within the system 300, too. The sensor 322 detects focus drift at least indirectly. For example, the sensor 322 may measure heat of the lens 304 to indirectly detect focus drift, or may directly measure focus to detect focus drift.

In response to the sensor 322 detecting focus drift, the mask adjuster 324 adjusts the variable transmission mask 308 to maintain focus of the pattern of the mask or reticle 312 on the wafer 316. For example, where the mask 308 is an LCD, the adjuster 324 may darken the mask 308 to reduce the transmission of light therethrough. More generally, the adjuster 324 causes the mask 308 to reduce the transmission of light through the mask 308. This adjustment occurs in real time, so that it can occur while semiconductor processing is being performed.

Also in response to the sensor 322 detecting focus drift, two other operations can be optionally performed. First, the heating factor adjuster 326 can adjust the heating factor of the exposure and alignment unit 302, where the unit 302 has such a heating factor. Reducing the heating factor, for example, may sharpen the image on the wafer 316 or otherwise increase focus. Second, the stage adjuster 328 can adjust the vertical position of the stage 318, as indicated by the arrows 320 and 322, to maintain or increase focus.

In one embodiment, the mask adjuster 324, the heating factor adjuster 326, and/or the stage adjuster 328 compensate for focus drift according to the model represented by $$F(t) = TSQ\left[\mu_1\left(1 - \exp\left(\frac{-t}{\tau_1}\right)\right) + \mu_2\left(1 - \exp\left(\frac{-t}{\tau_2}\right)\right)\right], \quad (1)$$

where $m_1$, $m_2$, $t_1$, and $t_2$ are constants associated with the exposure and alignment unit, and T, S, and Q are the reticle transmission factor, the reticle masking area, and the intensity of exposure energy, respectively. F(t) is the focus as a function of time.

Figure 4:
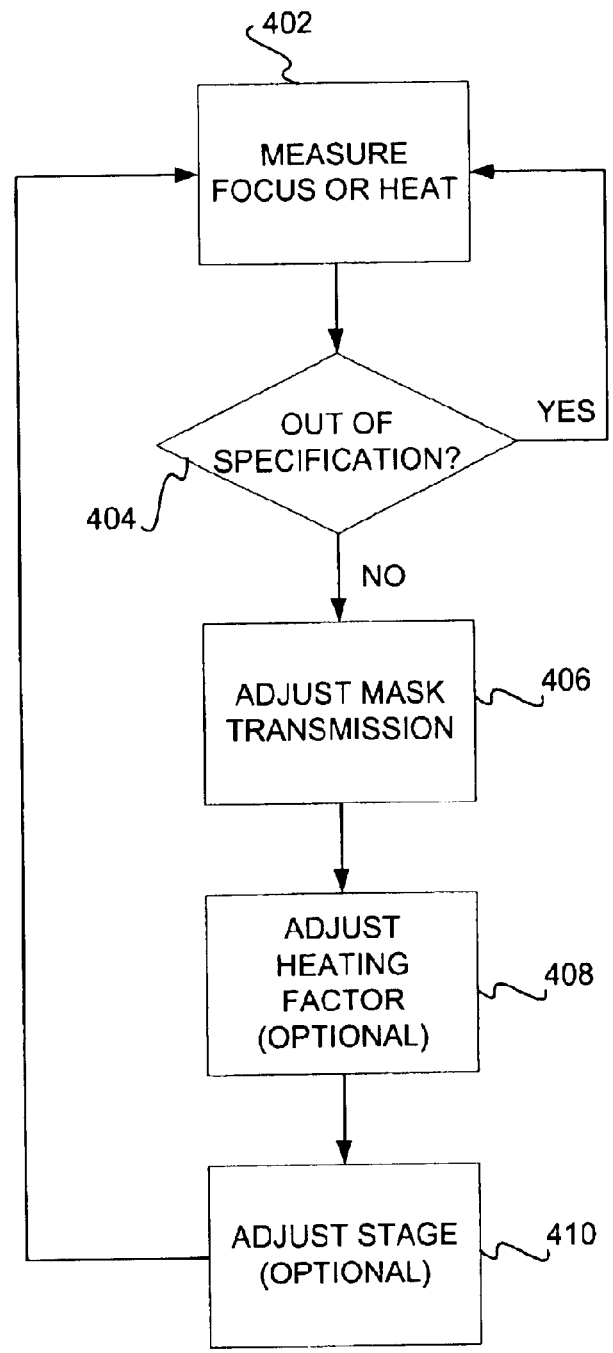
FIG. 4 is a flowchart of a method for compensating for heating of the lens of semiconductor fabrication exposure and alignment equipment, and the focus drift this heating causes, according to an embodiment of the invention.

FIG. 4 shows a method 400 according to an embodiment of the invention. First, focus of a semiconductor fabrication alignment and exposure equipment is at least indirectly measured (402). For example, the heat of a lens of the equipment may be directly measured to indirectly infer the focus. Alternatively, the focus may itself be directly measured. The focus is either within specification, and thus acceptable, or out of specification, and thus unacceptable. If the former (404), then the method 400 repeats. Thus, the method 400 can be performed in real time, during the semiconductor processing or fabrication of a semiconductor device using the equipment.

If the focus is out of specification (404), however, then in response, the transmission of light rating of a variable transmission focal mask below the lens of the equipment is adjusted, to adjust the focus so that it is back within specification (406). This can be accomplished as has been described. For example, the transmission of light through the mask may be reduced, such as darkening the mask, where the mask is an LCD. Next, optionally the heating factor of the equipment is adjusted (409), to further adjust the focus so that it is back within specification, as has been described. Finally, optionally the stage on which the semiconductor wafer is positioned is adjusted (410), to also adjust the focus so that it is back within specification, as has been described. The method 400 then repeats, such that when focus is again out of specification, adjustments are made to bring the focus back within specification.

It is noted that, although specific embodiments have been illustrated and described herein, it will be appreciated by those of ordinary skill in the art that any arrangement is calculated to achieve the same purpose may be substituted for the specific embodiments shown. This application is intended to cover any adaptations or variations of the present invention. Therefore, it is manifestly intended that this invention be limited only by the claims and equivalents thereof.

What is claimed is:

1. A semiconductor fabrication alignment and exposure equipment comprising:
   an exposure and alignment unit including a light source and a lens;
   one of a mask and a reticle having a pattern imprinted thereon;
   a variable transmission mask under the lens and above the one of the mask and the reticle that normally has a substantially high transmission of light rating that can be adjusted downward in real time to adjust focus;
   a sensor to at least indirectly measure the focus to determine whether the focus is out of specification; and,
   a stage on which a wafer is placed for exposure to the light source through the one of the mask and the reticle.

2. The equipment of claim 1, further comprising a mask adjuster to adjust the transmission of light rating downward to adjust the focus in response to the sensor determining that the focus is out of specification.

3. The equipment of claim 1, wherein the variable transmission mask comprises a liquid crystal display (LCD) that can be darkened to reduce transmission of light to adjust the focus in response to the sensor determining that the focus is out of specification.

4. The equipment of claim 3, further comprising a mask adjuster to darken the LCD to reduce the transmission of light to adjust the focus in response to the sensor determining that the focus is out of specification.

5. The equipment of claim 1, further comprising a heating factor adjuster to adjust a heating factor of the exposure and alignment unit to adjust the focus in response to the sensor determining that the focus is out of specification.

6. The equipment of claim 1, further comprising a stage adjuster to adjust the stage vertically to adjust the focus in response to the sensor determining that the focus is out of specification.

7. The equipment of claim 1, wherein the sensor directly measures the focus.

8. The equipment of claim 1, wherein the sensor indirectly measures the focus by measuring heat of the lens of the exposure and alignment unit.

9. A lens heating compensation mechanism for a semiconductor fabrication and exposure equipment comprising:
   a sensor to at least indirectly measure focus;
   a variable transmission mask under a lens of the equipment and above one of a mask and a reticle of the equipment having a pattern imprinted thereon, normally having a substantially high but adjustable transmission of light rating; and,
   a mask adjuster to adjust the transmission of light rating downward in real time to adjust the focus in response to the sensor determining that the focus is out of specification.

10. The lens heating compensation mechanism of claim 9, further comprising at least one of:
    a heating factor adjuster to adjust a heating factor of the equipment to adjust the focus in response to the sensor determining that the focus is out of specification; and,
    a stage adjuster to adjust a stage of the equipment vertically to adjust the focus in response to the sensor determining that the focus is out of specification.

11. The lens heating compensation mechanism of claim 10, wherein the sensor, the mask adjuster, the heating factor adjuster, and the stage adjuster are part of electronics of the lens heating compensation mechanism.

12. The lens heating compensation mechanism of claim 9, wherein the sensor directly measures the focus.

13. The lens heating compensation mechanism of claim 9, wherein the sensor indirectly measures the focus by measuring heat of the lens of the exposure and alignment unit.

14. A method comprising:
    at least indirectly measuring focus of a semiconductor fabrication exposure and alignment equipment; and,
    in response to determining that the focus is out of specification, adjusting in real time a transmission of light rating of a variable transmission mask below a lens of the equipment and above a mask and a reticle having a pattern imprinted thereon, to adjust the focus.

15. The method of claim 14, further comprising, in response to determining that the focus is out of specification, adjusting a heating factor of the equipment to adjust the focus.

16. The method of claim 14, further comprising, in response to determining that the focus is out of specification, adjusting vertically a stage of the equipment on which a semiconductor wafer is placed, to adjust the focus.

17. The method of claim 14, wherein at least indirectly measuring the focus comprises indirectly measuring the focus by measuring heat of the lens of the equipment.

18. The method of claim 14, wherein at least indirectly measuring the focus comprises directly measuring the focus.

* * * * *